(12) United States Patent
Kim et al.

(10) Patent No.: US 7,154,144 B2
(45) Date of Patent: Dec. 26, 2006

(54) SELF-ALIGNED INNER GATE RECESS CHANNEL TRANSISTOR AND METHOD OF FORMING THE SAME

(75) Inventors: Ji-Young Kim, Yongin (KR); Chang-Hyun Cho, Yongin (KR); Soo-Ho Shin, Yongin (KR); Tae-Young Chung, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 310 days.

(21) Appl. No.: 10/730,996

(22) Filed: Dec. 10, 2003

(65) Prior Publication Data

US 2005/0020086 A1 Jan. 27, 2005

(30) Foreign Application Priority Data

Jul. 23, 2003 (KR) ...................... 10-2003-0050459

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/328; 257/331; 257/330; 257/332

(58) Field of Classification Search ........ 257/328–334, 257/382–412; 438/268–272
See application file for complete search history.

(56) References Cited

U.S. PATENT DOCUMENTS

| 4,536,782 A | | 8/1985 | Brown | 357/23.1 |
| 5,371,024 A | * | 12/1994 | Hieda et al. | 438/270 |
| 6,150,219 A | * | 11/2000 | Tung | 438/270 |
| 6,358,800 B1 | | 3/2002 | Tseng et al. | 438/268 |
| 6,448,590 B1 | * | 9/2002 | Adkisson et al. | 257/202 |
| 6,677,209 B1 | * | 1/2004 | Farrar | 438/296 |

FOREIGN PATENT DOCUMENTS

KR  2003-0019581  3/2003

* cited by examiner

*Primary Examiner*—Cuong Nguyen
(74) *Attorney, Agent, or Firm*—Lee & Morse, P.C.

(57) ABSTRACT

A self-aligned inner gate recess channel in a semiconductor substrate includes a recess trench formed in an active region of the substrate, a gate dielectric layer formed on a bottom portion of the recess trench, recess inner sidewall spacers formed on sidewalls of the recess trench, a gate formed in the recess trench so that an upper portion of the gate protrudes above an upper surface of the substrate, wherein a thickness of the recess inner sidewall spacers causes a center portion of the gate to have a smaller width than the protruding upper portion and a lower portion of the gate, a gate mask formed on the gate layer, gate sidewall spacers formed on the protruding upper portion of gate and the gate mask, and a source/drain region formed in the active region of the substrate adjacent the gate sidewall spacers.

14 Claims, 11 Drawing Sheets

SELF-ALIGNED INNER GATE RECESS CHANNEL TRANSISTOR AND METHOD OF FORMING THE SAME

BACKGROUND OF THE INVENTION

1. Field of the Invention

The present invention relates to a recess channel transistor and a method of forming the same. More particularly, the present invention relates to a self-aligned recess channel transistor having an inner gate with a center portion that has a smaller width than a protruding upper portion and a lower portion of the gate and a method of forming the same.

2. Description of the Related Art

Conventionally, a recess transistor is used to achieve a higher density as a cell size is scaled down to the sub-micron range. As a planar gate size narrows in a recess transistor, however, short channel effects, junction leakage, and source/drain breakdown voltage become significant issues. Conventional recess gates have several disadvantages. A disadvantage of a conventional recess transistor, for example, is a large gate oxide area, which increases a gate loading capacitance. Additionally, another disadvantage of a conventional recess transistor structure is a deep junction depth, which increases a gate to source/drain overlap capacitance and a bit line loading capacitance. A conventional recess gate structure has a further disadvantage of having a weak photo misalign margin.

SUMMARY OF THE INVENTION

In an effort to overcome at least some of the problems described above, the present invention provides a self-aligned recess channel transistor having a gate with a center portion that has a smaller width than a protruding upper portion and a lower portion of the gate and a method of forming the same.

It is a feature of an embodiment of the present invention to provide a self-aligned inner gate recess channel in a semiconductor substrate including a recess trench formed in an active region of the substrate, a gate dielectric layer formed on a bottom portion of the recess trench, recess inner sidewall spacers formed on sidewalls of the recess trench, a gate formed in the recess trench so that an upper portion of the gate protrudes above an upper surface of the substrate, wherein a thickness of the recess inner sidewall spacers causes a center portion of the gate to have a smaller width than the protruding upper portion and a lower portion of the gate, a gate mask formed on the gate layer, gate sidewall spacers formed on the protruding upper portion of gate and the gate mask, and a source/drain region formed in the active region of the substrate adjacent the gate sidewall spacers.

Preferably, the recess trench has a width at an opening thereof of about 900 Å and a depth of between about 1300–1800 Å. Preferably, the shallow trench isolation region has a depth of approximately 3000 Å.

Preferably, the substrate includes a shallow trench isolation region and the active region includes a well region, a threshold voltage control region, and a source/drain region.

The gate dielectric layer may be an oxide layer, an oxynitride layer, an alumina ($Al_2O_3$) layer, or a ruthenium oxide (RuO) layer and have a thickness of about 50 Å.

Preferably, the recess inner sidewall spacers have a thickness of about 200 Å and are formed of either silicon oxide or silicon nitride.

The gate formed in the recess trench may include a first gate layer formed in a bottom portion of the recess trench and a second gate layer formed on the first gate layer in an upper portion of the recess trench, the second gate layer having a lower portion within the recess trench and an upper portion that protrudes above the upper surface of the substrate, wherein a thickness of the recess inner sidewall spacers causes the lower portion of the second gate layer to have a smaller width than the protruding upper portion of the second gate layer and the first gate layer. The first gate layer may be a poly gate layer and have a thickness of about 800 Å. The second gate layer may be a poly gate layer.

Preferably, the source/drain region in the active region of the substrate is an $n^+$ source/drain region.

It is another feature of an embodiment of the present invention to provide a method of forming a self-aligned inner gate recess channel in a semiconductor substrate including sequentially depositing an oxide mask layer, a poly mask layer, and a photoresist layer on the substrate having an active region, etching the poly mask layer, the oxide mask layer and the active region of the substrate to form a recess trench, forming recess inner sidewall spacers on sidewalls of the recess trench, etching a bottom portion of the recess trench to increase a depth of the recess trench, enlarging a width of the bottom portion of the recess trench below the recess inner sidewall spacers, forming a gate dielectric on the bottom portion of the recess trench, forming a gate in the recess trench so that an upper portion of the gate protrudes above an upper surface of the substrate, wherein a thickness of the recess inner sidewall spacers causes a center portion of the gate to have a smaller width than the protruding upper portion and a lower portion of the gate, forming a gate mask on the gate, forming gate sidewall spacers on the protruding upper portion of the gate and the gate mask, and performing an ion implantation process to form a source/drain region in the active region of the substrate adjacent the gate sidewall spacers.

The method may further include enlarging a lower portion of the recess trench, prior to forming the recess inner sidewall spacers on sidewalls of the recess trench.

Preferably, etching the poly mask layer, the oxide mask layer and the active region of the substrate to form the recess trench includes etching the poly mask layer using the photoresist layer as a mask and removing the photoresist layer and etching the active region of the substrate using the etched poly mask layer as a mask to form the recess trench and removing the poly mask layer.

Preferably, forming the recess inner sidewall spacers includes depositing a spacer layer on the substrate and the recess trench using a LPCVD process and anisotropically etching the spacer layer to form the recess inner sidewall spacers on the sidewalls of the recess trench.

It is still another feature of an embodiment of the present invention to provide a method of forming a self-aligned inner gate recess channel in a semiconductor substrate including sequentially depositing an oxide mask layer, a poly mask layer, and a photoresist layer on the substrate having an active region, etching the poly mask layer, the oxide mask layer and the active region of the substrate to form a recess trench, forming a gate dielectric layer within the recess trench, forming and etching a first gate layer to partially fill a lower portion of the recess trench, forming recess inner sidewall spacers on sidewalls of an upper portion of the recess trench above the first gate layer, forming and etching a second gate layer on the first gate layer to form a gate in the recess trench so that an upper portion of the second gate layer protrudes above an upper surface of the substrate, wherein a thickness of the recess inner sidewall spacers causes a lower portion of the second gate layer to have a smaller width than the protruding upper portion of the second gate layer and the first gate layer, forming a gate mask on the second gate layer, forming gate sidewall spacers on the protruding upper portion of the second gate layer and the gate mask, and performing an ion implantation process to form a source/drain region in the active region of the substrate adjacent the gate sidewall spacers.

The method may further include enlarging a lower portion of the recess trench, prior to forming the recess inner sidewall spacers on sidewalls of the recess trench.

Preferably, forming the first gate layer includes depositing a first gate layer on the substrate and recess trench to fill the recess trench and performing an etchback process on the first gate layer until the first gate layer remains only in the lower portion of the recess trench.

Preferably, forming the recess inner sidewall spacers includes depositing a spacer layer on the substrate and the recess trench using a LPCVD process and anisotropically etching the spacer layer to form the recess inner sidewall spacers on the sidewalls of the recess trench.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 2 through 11 illustrate cross-sectional views of stages in a method of forming self-aligned inner gate recess channel transistor according to the first embodiment of the present invention, wherein FIGS. 2 through 9 and 11 illustrate cross-sectional views taken along line I–I' of FIG. 1 and FIG. 10 illustrates a cross-sectional view taken along line II–II' of FIG. 1;

FIGS. 13 through 22 illustrate cross-sectional views of stages in a method of forming a self-aligned inner gate recess channel transistor according to the second embodiment of the present invention, wherein FIGS. 13 through 20 and 22 illustrate cross-sectional views taken along line I–I' of FIG. 12 and FIG. 21 illustrates a cross-sectional view taken along line II–II' of FIG. 12.

DETAILED DESCRIPTION OF THE INVENTION

Figure 1:
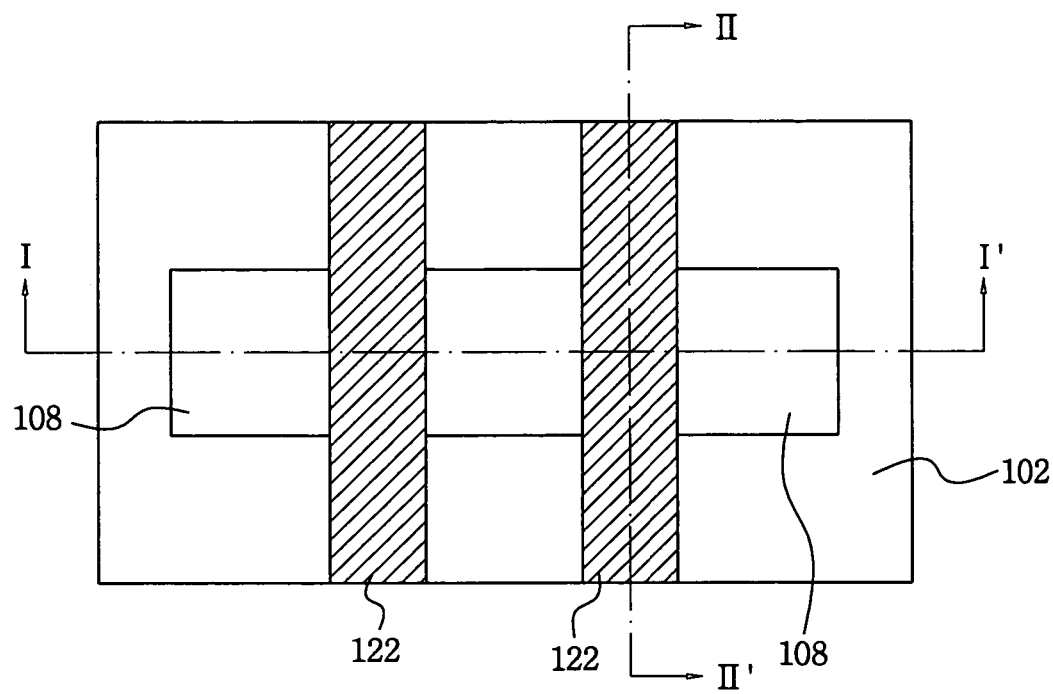
FIG. 1 illustrates a top view of a layout of a self-aligned recess channel transistor according to a first embodiment of the present invention.

The present invention will now be described more fully hereinafter with reference to the accompanying drawings, in which preferred and alternate embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals and characters refer to like elements throughout.

First Embodiment

FIG. 1 illustrates a top view of a layout of a self-aligned recess channel transistor according to a first embodiment of the present invention. FIGS. 2 through 11 illustrate cross-sectional views of stages in a method of forming a self-aligned inner gate recess channel transistor according to the first embodiment of the present invention. More specifically, FIGS. 2 through 9 and 11 illustrate cross-sectional views taken along line I–I' of FIG. 1 and FIG. 10 illustrates a cross-sectional view taken along line II–II' of FIG. 1.

FIG. 1 illustrates a gate layer 122 formed over an active area 108 and a field area 102 of a semiconductor substrate. FIG. 1 includes cross-sectional lines I–I' and II–II' taken along an x-direction and a y-direction, respectively, of the semiconductor substrate.

Figure 2:
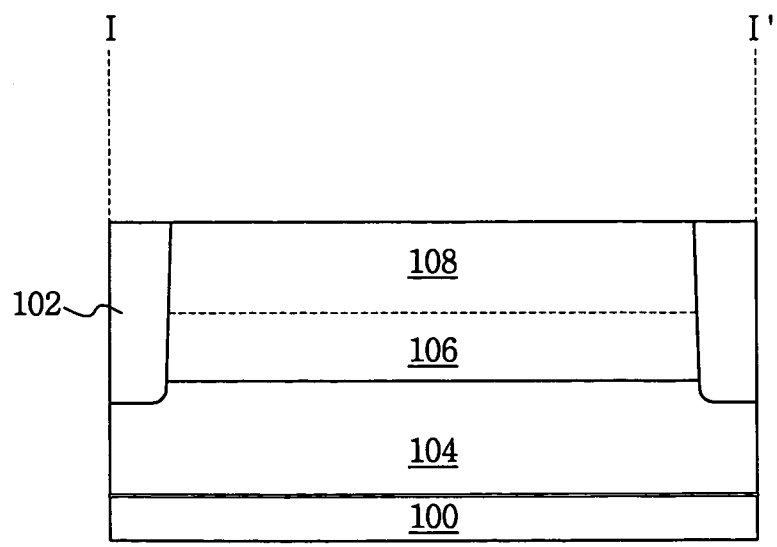

Referring now to FIG. 2, FIG. 2 illustrates a cross-sectional view, taken along line I–I' of FIG. 1, of an initial stage in the method of forming the self-aligned inner gate recess channel transistor according to the first embodiment of the present invention. A substrate 100, including a well region 104, is provided. Preferably, the well region 104 is formed using an ion implantation process. A shallow trench isolation (STI) region 102 is conventionally formed by anisotropically etching a trench and filling the trench with an insulation layer. The STI region 102 forms a field area of the semiconductor substrate. Preferably, the STI trench has a depth of about 3000 Å. Threshold voltage ($V_t$) control ions are implanted by an ion implantation process on the well region 104 to form a $V_t$ control region 106. Subsequently, source/drain (S/D) ions are implanted by an ion implantation process to form a source/drain (S/D) region 108. The source/drain (S/D) region 108 forms an active area of the semiconductor substrate. Preferably, the source/drain (S/D) region 108 is an $N^-$ source/drain (S/D) region.

Figure 3:
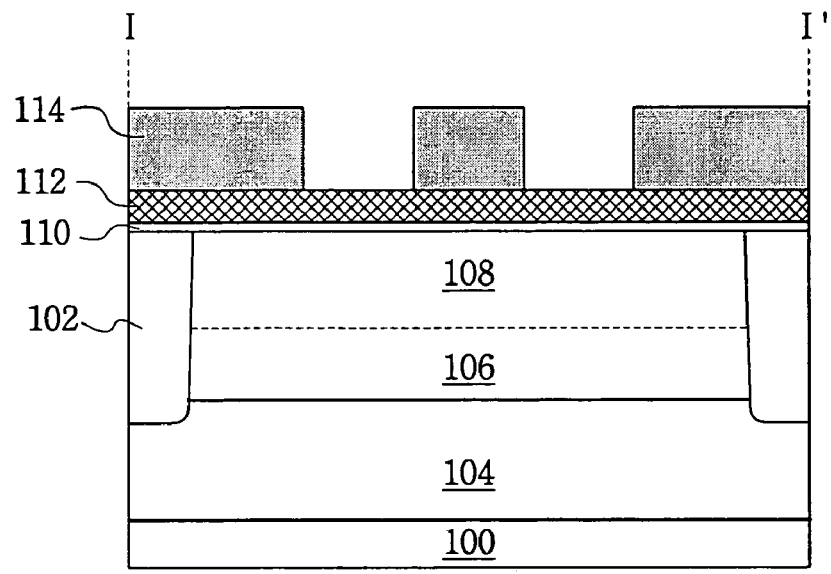

Referring to FIG. 3, an oxide mask layer 110 is formed on the active area 108 and the field area 102. Preferably, the oxide mask layer 110 is formed to a thickness of about 200 Å. Next, a poly mask layer 112 is formed on the oxide mask layer 110 using a low-pressure chemical vapor deposition (LPCVD). Preferably, the poly mask layer 112 is a ploy hard mask layer and is formed to a thickness of about 1000 Å. A recess pattern is then formed on the poly mask layer 112 by depositing a photoresist 114 and performing a photolithographic process.

Figure 4:
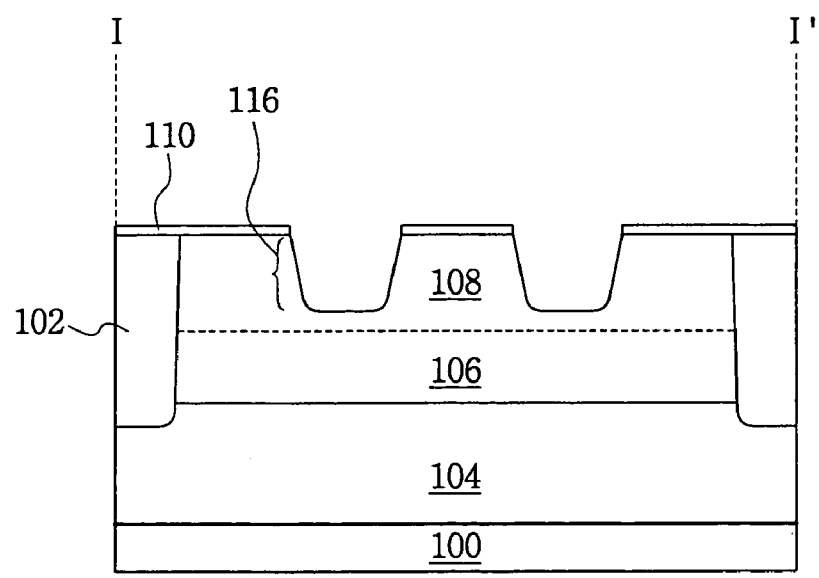

Referring to FIG. 4, a first recess hole 116 is formed in the active area 108 using a two-step isotropical etching process. In a first step, the poly hard mask 112 is etched using the photoresist (114 of FIG. 3) as a mask and then the photoresist is removed using a photoresist stripping process. In a second step, the active area 108 of the substrate is etched using the etched poly hard mask (114 of FIG. 3) as a pattern to form the first recess hole 116. Subsequently, the poly hard mask 112 is removed. Preferably, the first recess hole 116 has a depth of about 1000 Å.

Figure 5:
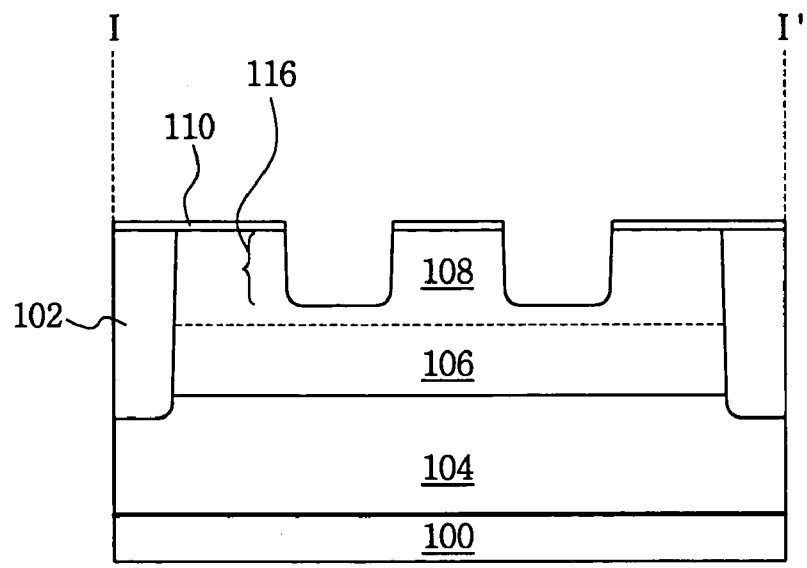

In FIG. 5, an optional etching process is performed to enlarge a width of a lower portion of the first recess hole 116. The etching process may use a chemical dry etch (CDE) process. The first recess hole 116 is preferably enlarged by a thickness of about 200 Å. Preferably, a width of an opening of the first recess hole 116 is about 900 Å.

Figure 6:
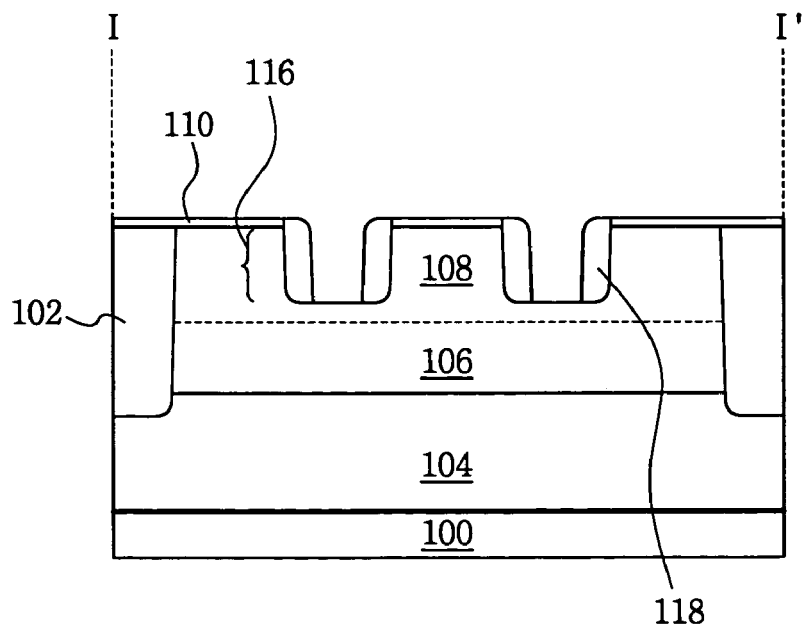
Figure 7:
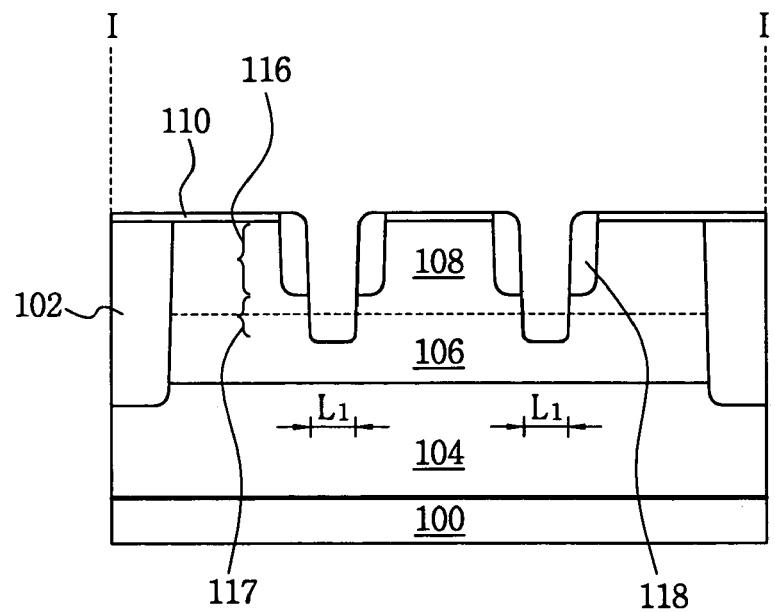

Referring to FIG. 6, a spacer layer is deposited on the sides of the first recess hole 116, the active area 108, and the field area 102 using a LPCVD process. The spacer layer is then anisotropically etched to form a recess inner oxide spacer 118. Preferably, the recess inner oxide spacer 118 has a thickness of about 200 Å. Although the inner spacer 118 is described as an inner oxide spacer, the spacer layer may be formed of either silicon oxide (SiO) or silicon nitride (SiN). As shown in FIG. 7, a second recess hole 117 is formed by anisotropically etching a bottom of the first recess hole 116 below the recess inner oxide spacer 118. Preferably, the second recess hole 117 has a depth of about 300 Å. A width $L_1$ of the first recess hole 116 and the second hole recess 117 is approximately 500 Å.

Figure 8:
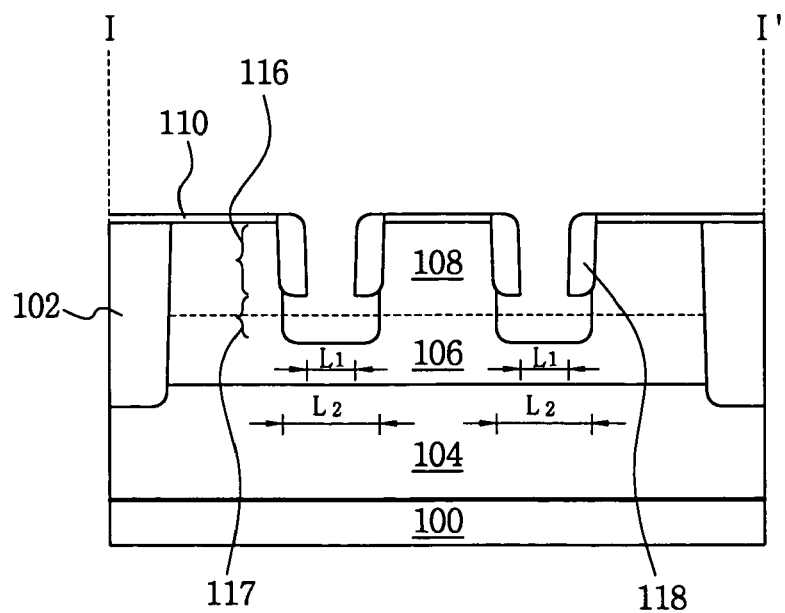

Referring to FIG. 8, the initial width $L_1$ of the second recess hole 117 is enlarged using a chemical dry etching (CDE) process. Preferably, the enlarged width $L_2$ of the second recess hole 117 is increased to a width of about 900 Å. A final total recess depth of the first recess hole 116 and the second recess hole 117 is preferably about 1300–1800 Å.

Figure 9:
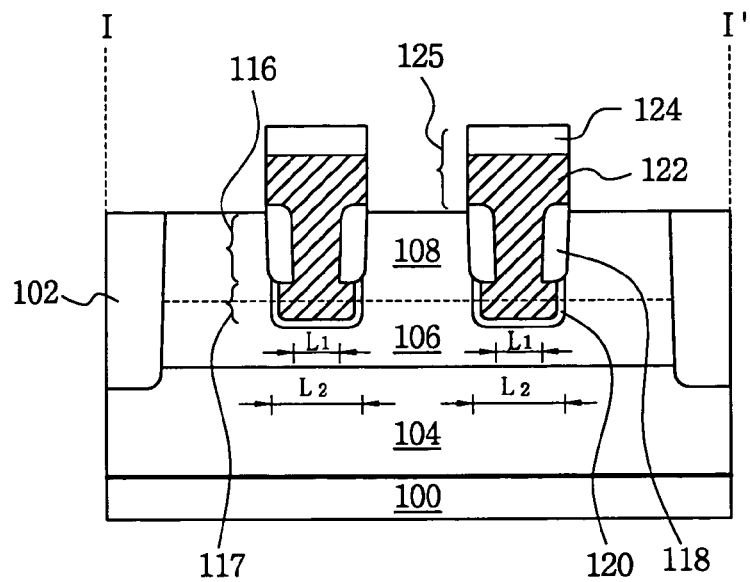
Figure 10:
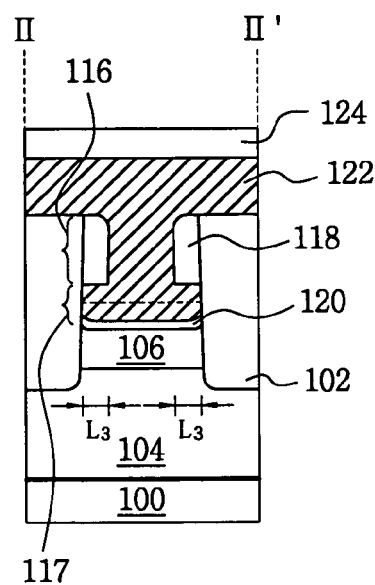
Figure 11:
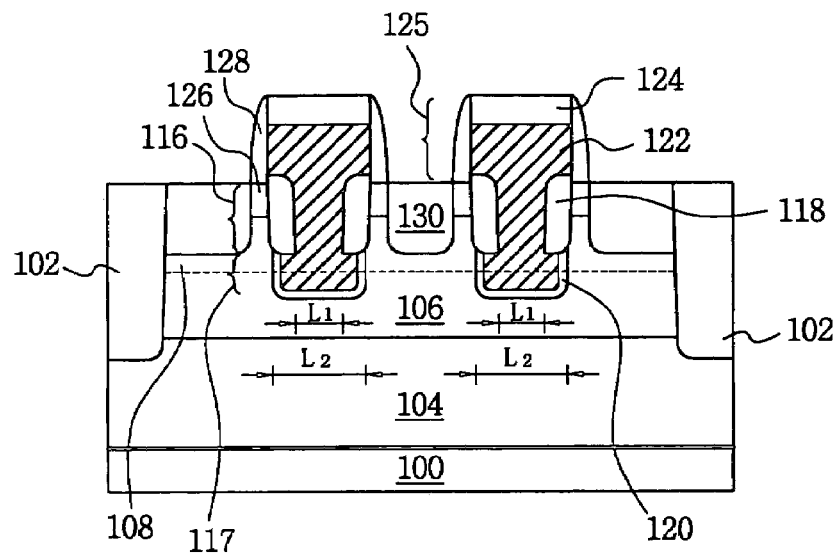

As shown in FIG. 9, a gate dielectric layer 120 is formed on sidewalls of the second recess hole 117. The gate dielectric layer 120 may be an oxide layer, an oxynitride layer, an alumina ($Al_2O_3$) layer, or a ruthenium oxide (RuO) layer. The gate dielectric layer 120 may be formed using a thermal oxidation process. Preferably, the gate dielectric layer 120 has a thickness of about 50Å. Subsequently, a gate layer and a gate mask layer are formed on the active area 108, the field area 102, and the first recess hole 116 using a LPCVD process. A gate 122 and a gate mask 124 are then formed using photolithography and an etching process. An upper portion 125 of the gate 122, which additionally includes the gate mask 124, protrudes above an upper surface of the substrate. FIG. 10 illustrates a cross-sectional view, taken along line II–II' of FIG. 1, of the stage in the method of forming the recess gate shown in FIG. 9. FIG. 10 further illustrates a thickness $L_3$ of the recess inner oxide spacer 118, which is preferably 200 Å. FIG. 11 illustrates a completed structure of a recess channel according to the first embodiment the present invention. As shown in FIG. 11, a gate spacer layer is deposited on the gate mask 124, the active area 108 and the field area 102. The gate spacer layer is then anisotropically etched to form a sidewall spacer 128 on the gate 122 and the gate mask 124. Subsequently, source/drain (S/D) ions 130 are implanted using an ion implantation process on the active area 108 to form an S/D region 130. Preferably, the S/D ions are $N^+$ ions implanted to form an $N^+$ S/D region.

In the first embodiment of the present invention, a recess inner oxide spacer is a relatively thick oxide layer, which decreases a gate loading capacitance and a bit line loading capacitance, thereby increasing a refresh time. In addition, the recess inner oxide spacer improves the photo misalign margin and reduces a S/D junction capacitance, thereby increasing a device speed.

Second Embodiment

Figure 12:
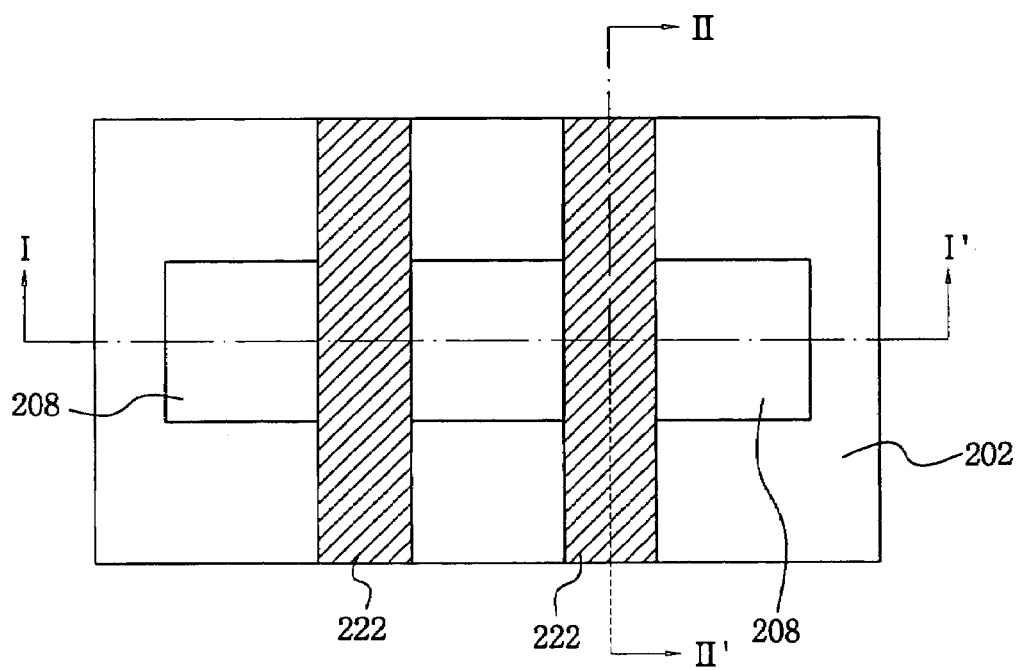
FIG. 12 illustrates a top view of a layout of a self-aligned recess channel transistor according to a second embodiment of the present invention.

FIG. 12 illustrates a top view of a layout of a self-aligned recess channel transistor according to a second embodiment of the present invention. FIGS. 13 through 22 illustrate cross-sectional views of stages in a method of forming a self-aligned inner gate recess channel transistor according to the second embodiment of the present invention. More specifically, FIGS. 13 through 20 and 22 illustrate cross-sectional views taken along line I–I' of FIG. 12 and FIG. 21 illustrates a cross-sectional view taken along line II–II' of FIG. 12.

FIG. 12 illustrates a gate layer 222 formed over an active area 208 and a field area 202 of a semiconductor substrate. FIG. 12 includes cross-sectional lines I–I' and II–II' taken along an x-direction and a y-direction, respectively, of the semiconductor substrate.

Figure 13:
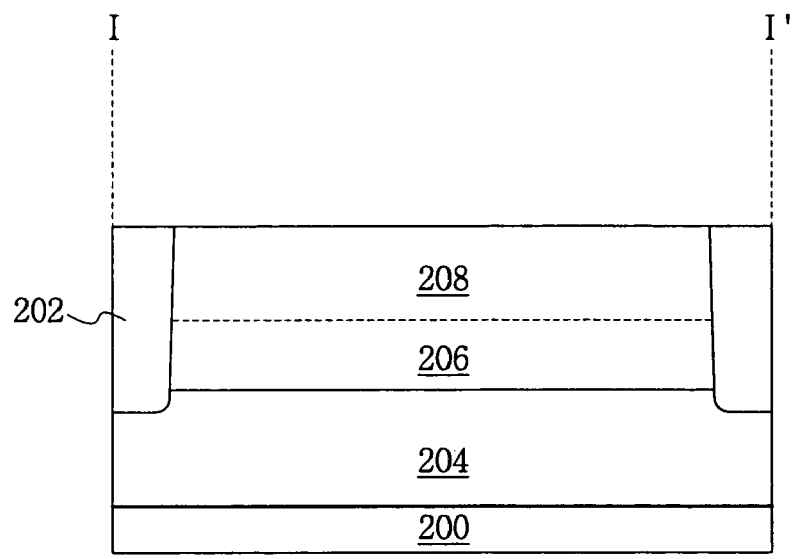

Referring to FIG. 13, FIG. 13 illustrates a cross-sectional view, taken along line I–I' of FIG. 12, of an initial stage in the method of forming the self-aligned inner gate recess channel transistor according to the second embodiment of the present invention. A substrate 200, including a well region 204, is provided. Preferably, the well region 204 is formed using an ion implantation process. A shallow trench isolation (STI) region 202 is conventionally formed by anisotropically etching a trench and filling the trench with an insulation layer. The STI region 202 forms a field area of the semiconductor substrate. Preferably, the STI trench has a depth of about 3000 Å. Threshold voltage ($V_t$) control ions are implanted by an ion implantation process on the well region 204 to form a $V_t$ control region 206. Subsequently, source/drain (S/D) ions are implanted by an ion implantation process to form a source/drain (S/D) region 208. The source/drain (S/D) region 208 forms an active area of the semiconductor substrate. Preferably, the source/drain (S/D) region 208 is an $N^-$ source/drain (S/D) region.

Figure 14:
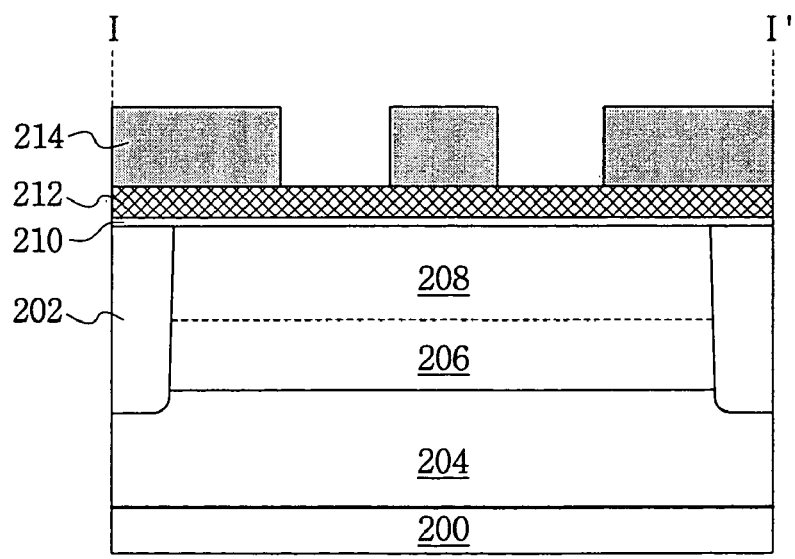

Referring to FIG. 14, an oxide mask layer 210 is formed on the active area 208 and the field area 202. Preferably, the oxide mask layer 210 is formed to a thickness of about 200 Å. Next, a poly mask layer 212 is formed on the oxide mask layer 210 using a low-pressure chemical vapor deposition (LPCVD). Preferably, the poly hard mask layer 212 is a poly hard mask and is formed to a thickness of about 1000 Å. A recess pattern is then formed on the poly mask layer 212 by depositing a photoresist 214 and performing a photolithographic process.

Figure 15:
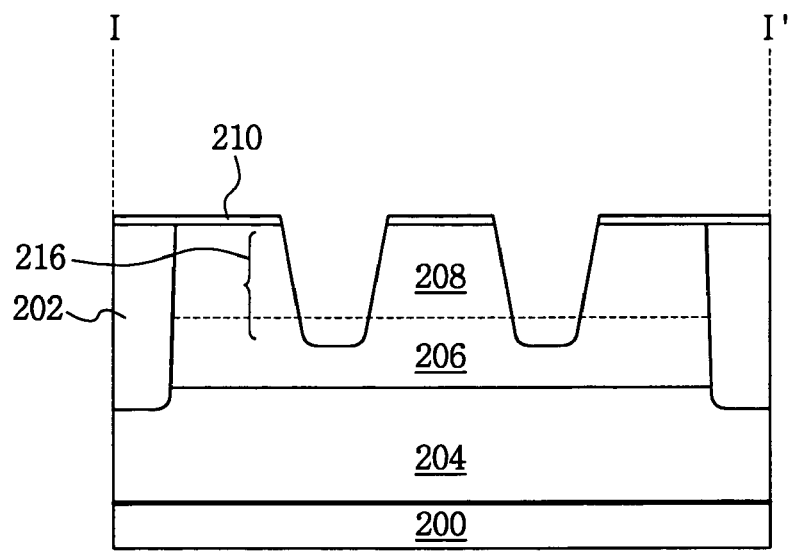

Referring to FIG. 15, a recess hole 216 is formed in the active area 208 using an isotropical etching process. Preferably, the recess hole 216 has a depth of about 1500 Å and a width at an opening of about 900 Å. Subsequently, the photoresist (214 of FIG. 14) is removed using a photoresist stripping process.

Figure 16:
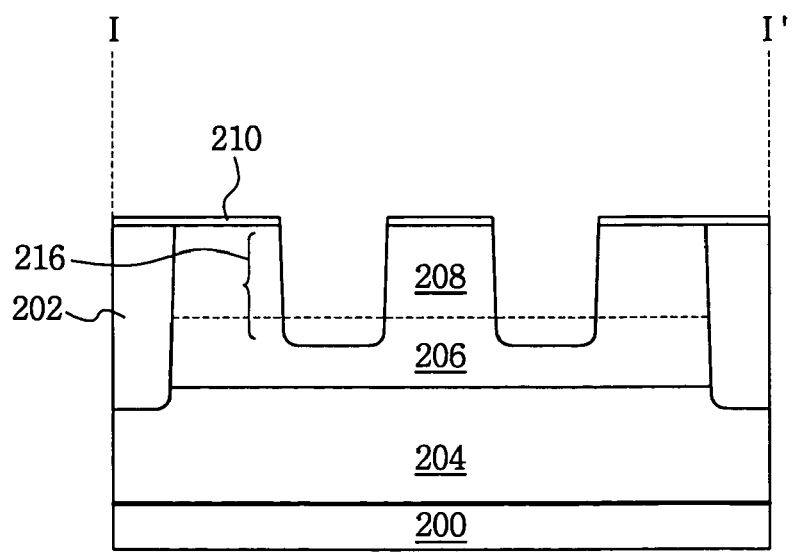

In FIG. 16, an optional etching process is performed to enlarge a width of a lower portion of the recess hole 216. The etching process may be a chemical dry etch (CDE) process. The recess hole 216 is preferably enlarged to a width of about 900 Å.

Figure 17:
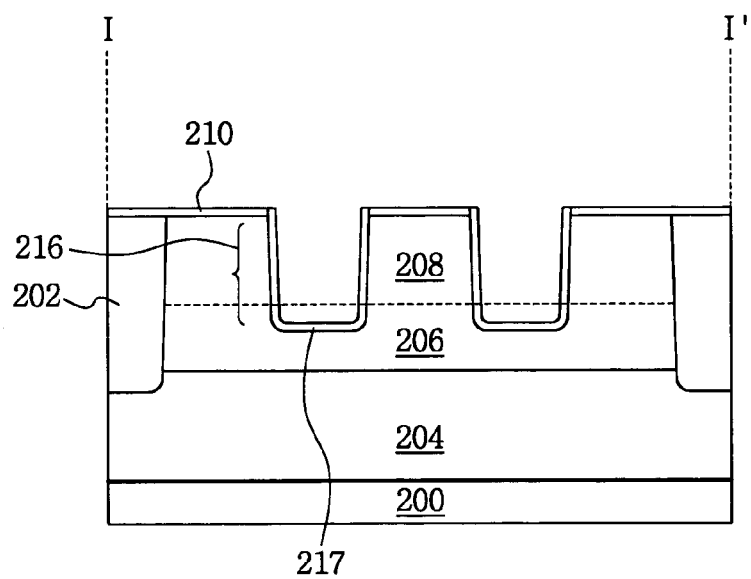

As shown in FIG. 17, a gate dielectric layer 217 is formed on sidewalls of the recess hole 216. The gate dielectric layer 217 may be an oxide layer, an oxynitride layer, an alumina ($Al_2O_3$) layer, or a ruthenium oxide (RuO) layer. The gate dielectric layer 217 may be formed using a thermal oxidation process. Preferably, the gate dielectric layer 217 has a thickness of about 50 Å.

Figure 18:
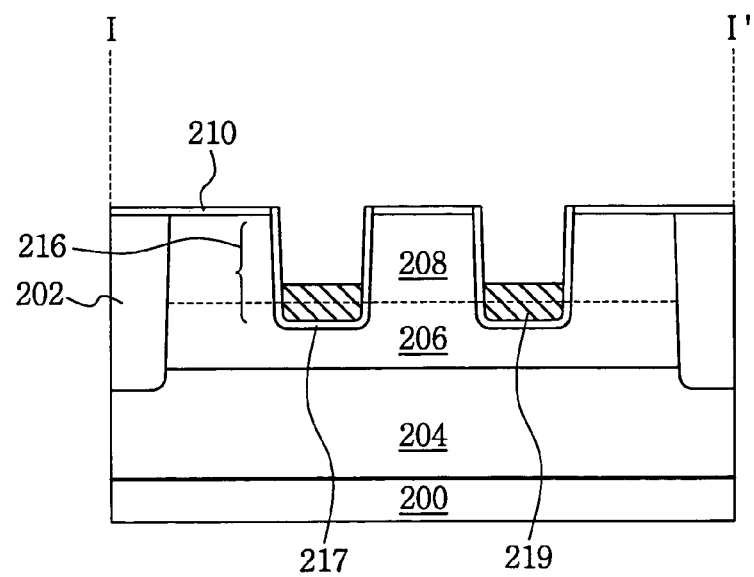

Referring to FIG. 18, a first poly gate layer 219 is deposited in the recess hole 216 using an LPCVD process and an etchback process. After the etchback process, the first poly gate layer 219 preferably has a remaining thickness of about 800 Å.

Figure 19:
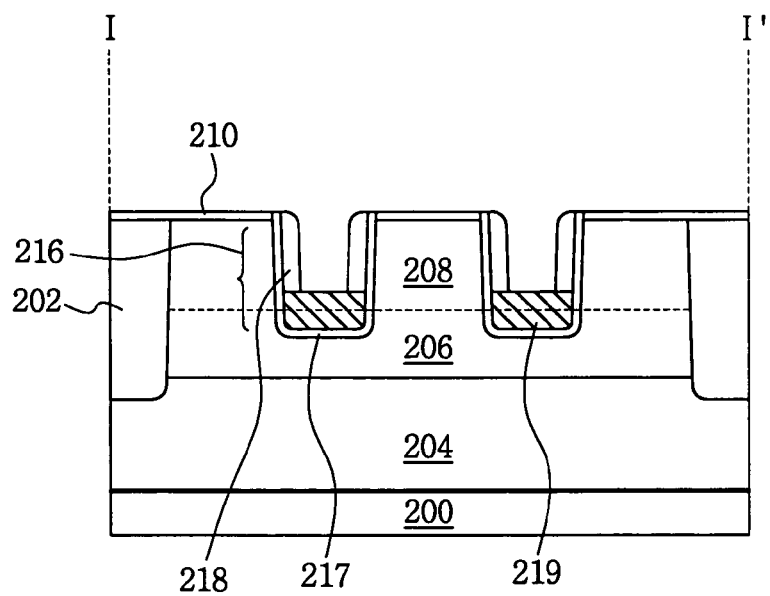

As shown in FIG. 19, a spacer layer is deposited on the sides of the recess hole 216, the active area 208, and the field area 202 using a LPCVD process. The spacer layer is then anisotropically etched to form a recess inner oxide spacer 218. Preferably, the recess inner oxide spacer 218 has a thickness of about 200 Å. Although the inner spacer 218 is described as an inner oxide spacer, the spacer layer may be formed of either silicon oxide (SiO) or silicon nitride (SiN).

Figure 20:
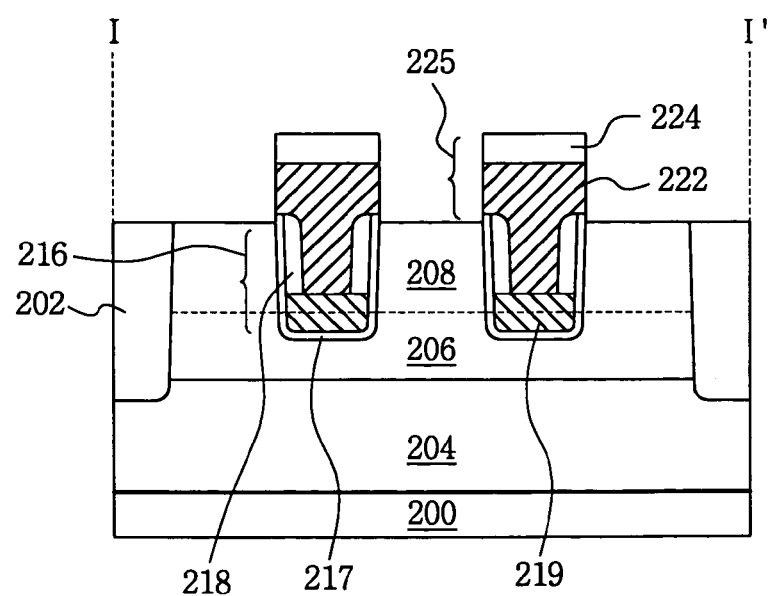
Figure 21:
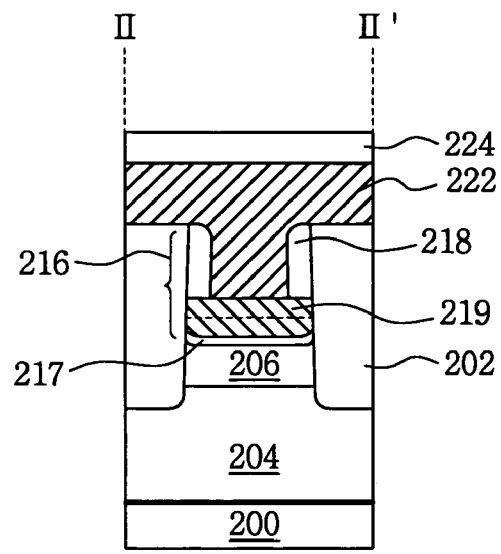

Subsequently, as shown in FIG. 20, a gate layer and a gate mask layer are formed on the active area 208, the field area 202, and the recess hole 216 using a LPCVD process. A gate 222 and a gate mask 224 are then formed using photolithography and an etching process. An upper portion 225 of the gate 222, which additionally includes the gate mask 224, protrudes above an upper surface of the substrate. FIG. 21 illustrates a cross-sectional view, taken along line II–II' of FIG. 12, of the stage in the method of forming the recess gate shown in FIG. 20.

Figure 22:
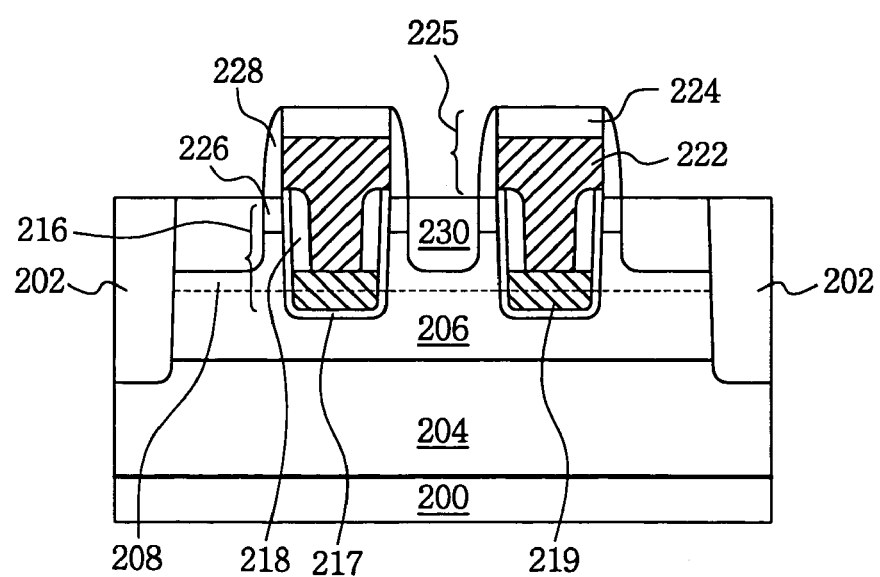

FIG. 22 illustrates a completed structure of a recess channel according to the second embodiment the present invention. As shown in FIG. 22, a gate spacer layer is deposited on the gate mask 224, the active area 208 and the field area 202. The gate spacer layer is then anisotropically etched to form a sidewall spacer 228 on the gate 222 and the gate mask 224. Subsequently, source/drain (S/D) ions are implanted using an ion implantation process on the active area 208 to form an S/D region 230. Preferably, the S/D ions are $N^+$ ions implanted to form an $N^+$ S/D region.

By way of comparison, whereas the first embodiment of the present invention discloses a two-step etching process to form the recess hole and a single step deposition process to form the gate, the second embodiment of the present invention discloses a single step etching process to form the recess hole and a two-step deposition process to form the gate.

Similar to the first embodiment of the present invention, in the second embodiment, a recess inner oxide spacer is a relatively thick oxide layer, which decreases a gate loading capacitance and a bit line loading capacitance, thereby increasing a refresh time. In addition, the recess inner oxide spacer improves the photo misalign margin and reduces a S/D junction capacitance, thereby increasing a device speed.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A self aligned inner gate recess channel in a semiconductor substrate, comprising:
   a. a recess trench formed in an active region of the substrate;
   b. a gate dielectric layer formed on a bottom portion of the recess trench;
   c. recess inner sidewall spacers formed on sidewalls of the recess trench;
   d. a gate formed in the recess trench so that an upper portion of the gate protrudes above an upper surface of the substrate, wherein a thickness of the recess inner sidewall spacers causes a center portion of the gate to have a smaller width than the protruding upper portion and a lower portion of the gate;
   e. a gate mask formed on the gate layer;
   f. gate sidewall spacers formed on the protruding upper portion of gate and the gate mask; and
   g. a source/drain region formed in the active region of the substrate adjacent the gate sidewall spacers, the recess inner sidewall spacers extending below an upper surface of the substrate a majority of a distance that the source/drain region extends below the upper surface and only a portion of a distance that the gate extends below the upper surface, and being sandwiched between the source/drain region and the gate.

2. The self-aligned inner gate recess channel as claimed in claim 1, wherein the recess trench has a width at an opening thereof of about 900 Å.

3. The self-aligned inner gate recess channel as claimed in claim 1, wherein the recess trench has a depth of between about 1300–1800 Å.

4. The self-aligned inner gate recess channel as claimed in claim 1, wherein the substrate comprises:
   a shallow trench isolation region; and
   the active region includes a well region, a threshold voltage control region, and a source/drain region.

5. The self-aligned inner gate recess channel as claimed in claim 4, wherein the shallow trench isolation region has a depth of approximately 3000 Å.

6. The self-aligned inner gate recess channel as claimed in claim 1, wherein the gate dielectric layer is selected from the group consisting of an oxide layer, an oxynitride layer, an alumina ($Al_2O_3$) layer, and a ruthenium oxide (RuO) layer.

7. The self-aligned inner gate recess channel as claimed in claim 1, wherein the gate dielectric has a thickness of about 50 Å.

8. The self-aligned inner gate recess channel as claimed in claim 1, wherein the recess inner sidewall spacers have a thickness of about 200 Å.

9. The self-aligned inner gate recess channel as claimed in claim 1, wherein the recess inner sidewall spacers are formed of either silicon oxide or silicon nitride.

10. The self-aligned inner gate recess channel as claimed in claim 1, wherein the gate formed in the recess trench comprises:
    a first gate layer formed in a bottom portion of the recess trench; and
    a second gate layer formed on the first gate layer in an upper portion of the recess trench, the second gate layer having a lower portion within the recess trench and an upper portion that protrudes above the upper surface of the substrate,
    wherein a thickness of the recess inner sidewall spacers causes the lower portion of the second gate layer to have a smaller width than the protruding upper portion of the second gate layer and the first gate layer.

11. The self-aligned inner gate recess channel as claimed in claim 10, wherein the first gate layer is a poly gate layer.

12. The self-aligned inner gate recess channel as claimed in claim 10, wherein the first gate layer has a thickness of about 800 Å.

13. The self-aligned inner gate recess channel as claimed in claim 10, wherein the second gate layer is a poly gate layer.

14. The self-aligned inner gate recess channel as claimed in claim 1, wherein the source/drain region in the active region of the substrate is an $n^+$ source/drain region.

* * * * *